United States Patent [19]

Harman

[11] Patent Number: 4,642,142
[45] Date of Patent: Feb. 10, 1987

[54] PROCESS FOR MAKING MERCURY CADMIUM TELLURIDE

[75] Inventor: Theodore C. Harman, Lexington, Mass.

[73] Assignee: Massachusetts Institute of Technology, Cambridge, Mass.

[21] Appl. No.: 770,821

[22] Filed: Aug. 28, 1985

Related U.S. Application Data

[63] Continuation-in-part of Ser. No. 379,530, May 19, 1982, abandoned.

[51] Int. Cl.$^4$ .......................................... H01L 21/368
[52] U.S. Cl. .................................... 148/171; 148/172; 148/DIG. 64; 156/601; 156/DIG. 72
[58] Field of Search ...................... 148/171, 172, 173; 156/601, DIG. 72

[56] References Cited

U.S. PATENT DOCUMENTS

| | | | |
|---|---|---|---|
| 3,713,900 | 1/1973 | Suzuki | 148/172 X |
| 3,723,190 | 3/1973 | Kruse et al. | 148/1.5 |
| 3,725,135 | 4/1973 | Hager et al. | 148/1.5 |
| 3,902,924 | 9/1975 | Maciolek | 148/1.5 |
| 4,088,514 | 5/1978 | Hara et al. | 148/171 |
| 4,089,714 | 3/1978 | Johnson et al. | 148/171 |
| 4,105,477 | 8/1978 | Johnson et al. | 148/187 |
| 4,263,065 | 4/1981 | Wang et al. | 148/171 |
| 4,317,689 | 3/1982 | Bowers et al. | 148/171 |
| 4,318,217 | 3/1982 | Jenner et al. | 148/1.5 X |
| 4,376,663 | 3/1983 | Wang et al. | 148/171 |
| 4,401,487 | 8/1983 | Lockwood | 148/171 |

OTHER PUBLICATIONS

Schmit et al., "LPE Growth of Hg$_{0.60}$Cd$_{0.40}$Te from Te-Rich Solution," *Appl. Phys. Lett.*, 35(6), Sep. 15, 1979, pp. 457 & 458.

*Primary Examiner*—George T. Ozaki
*Attorney, Agent, or Firm*—Paul J. Cook

[57] ABSTRACT

Mercury cadmium telluride (Hg$_{1-x}$Cd$_x$Te) is formed from an atmosphere of mercury vapor maintained at a temperature of within about 1° C. of a desired temperature which contacts a liquid cadmium-tellurium solution with or without mercury maintained at a temperature within about 1° C. of a desired temperature. The resultant mercury-cadmium-tellurium solution then is cooled to solidification.

9 Claims, 18 Drawing Figures

PERCENT OPTICAL TRANSMISSION VS WAVE NUMBER AND WAVELENGTH FOR TWO LPE LAYER-SUBSTRATE COMPOSITES

PROCESS FOR MAKING MERCURY CADMIUM TELLURIDE

The Government has rights in this invention purusant to contract No. AF19628-80-C-0002 awarded by the United States Air Force, and Contract Number DR-XRO-PH-17077-D, awarded by the U.S. Army. This application is a continuation-in-part of application Ser. No. 379,530 filed May 19, 1982, and now abandoned.

BACKGROUND OF THE INVENTION

This invention relates to a process for making the alloy, mercury cadmium telluride ($Hg_{1-x}Cd_xTe$) wherein x is the mole fraction of CdTe.

Mercury cadmium telluride is presently utilized as an infrared detector and can be utilized in solar cells, integrated electronic and optical circuits, as well as various component devices such as diodes, transistors, modulators, waveguides and lasers. Mercury cadmium telluride is a mixed crystal alloy system of mercury telluride and cadmium telluride which are mutually soluble in all compositions. Since cadmium telluride is a semiconductor and mercury telluride is a semi-metal, the alloy system ranges from semi-metal to semiconductor with an energy gap variation dependent upon the mole fration of cadmium telluride. It is desirable to obtain single crystal and high purity mercury cadmium telluride material from which to fabricate intrinsic infrared detectors or the like. However, the alloys of this system are difficult to synthesize in a controlled process since the alloys of the system are decomposing solids. When the solid phase of the alloy is heated in an open vessel, the components are lost at a rate so that congruent melting is impossible. Thus, prior art processes have prepared these solids in sealed containers generally at about 50 to 100 atmospheres at the liquidus temperature which increases the possibility of explosion.

The liquidus-solidus temperatures of the mercury telluride and cadmium telluride alloys are different, which causes their segregation as the alloy is frozen or solidified from a melt. The resultant point to point variation of the mole fraction of each of these two alloys in the solidified material results in a corresponding variation in energy gap and consequent variation in the electrical and optical properties throughout the material. Also, the alloys are defect solids in which deviations from stoichiometry which may occur from point to point within the material act as electrically active donors and acceptors.

U.S Pat. No. 3,725,135 to Hager et al discloses a process for forming mercury cadmium telluride by enclosing cadmium telluride substrates and mercury telluride in a closed evacuated container which are then heated to produce an atmosphere of excess mercury vapor pressure. This process requires a minimum of about 3 days to produce the desired alloy and, due to the seal-off procedure utilized, increases the probability of contamination. U.S. Pat. No. 3,723,190 to Kruse et al also utilizes a sealed evacuator container. In addition, like the Hagger et al process, the products produced are too thick for electronic devices so that the substrate and part of the alloy layer must be ground, polished or etched to be utilized in an electronic or optical device. Accordingly, it would be highly desirable to provide a process for producing mercury cadmium telluride alloy that permits obtaining a pure product, does not require high pressures and which require only relatively short time periods to produce the alloy.

SUMMARY OF THE INVENTION

In accordance with this invention, a mercury vapor stream is generated over a growth solution of cadmium and tellurium in a liquid phase epitaxial growth system to produce the desired alloy. In the process, a pure cadmium-tellurium solution or a suitable source of pure cadmium telluride and tellurium is heated in an open tube to a temperature slightly above the liquidus temperature of the desired mercury-cadmium-tellurium solution in an atmosphere of mercury vapor wherein the temperature of the cadmium-tellurium mixture and the mercury vapor are carefully controlled. The heating of the cadmium-tellurium mixture is conducted until the solution is nearly saturated with mercury. The temperature of the liquid mercury-cadmium-tellurium then is lowered to nearly the saturation solution temperature and it is then contacted with a source wafer of cadmium telluride. After about 1 hour, the source wafer is removed from the growth solution. Then, the growth solution is contacted with a substrate wafer and cooled so that the substrate is coated with mercury cadmium telluride. The coated substrate then is removed from the growth solution and annealed in the presence of mercury vapor to form the desired alloy wherein the deviation from the stoichiometric composition of the final alloy is controlled by controlling the coated substrate temperature and the mercury pressure during annealing.

DESCRIPTION OF SPECIFIC EMBODIMENTS

In order to produce satisfactory mercury cadmium telluride alloys in accordance with the process of this invention, it is necessary to maintain the temperature of the liquid mercury which is the source of mercury vapor and the temperature of the cadmium-tellurium growth solution within narrow limits. If these temperatures are not maintained within the narrow limits, phase separation, widely varying alloy compositions from run to run or deleterious precipitates will occur leading to an undesirable product. The particular temperatures utilized will depend upon the desired chemical composition of the final alloy. However, once the temperature is chosen, it must be maintained within a narrow limit of less than about 1° C., preferably less than about 0.2° C. The mercury vapor temperature chosen can range between about 25° C. and 350° C. The final alloy will contain a ratio of mercury to cadmium in the grown layer which is greater, the higher the mercury vapor temperature chosen for a given growth solution temperature. The growth solution temperature can range from about 425° C. and about 550° C., preferably 425° C. to 500° C. Once the growth solution temperature is chosen, it is necessary to maintain the temperature to within less than about 1° C., preferably less than about 0.2° C.

The present invention will be described with reference to the accompanying drawings.

Figure 1:
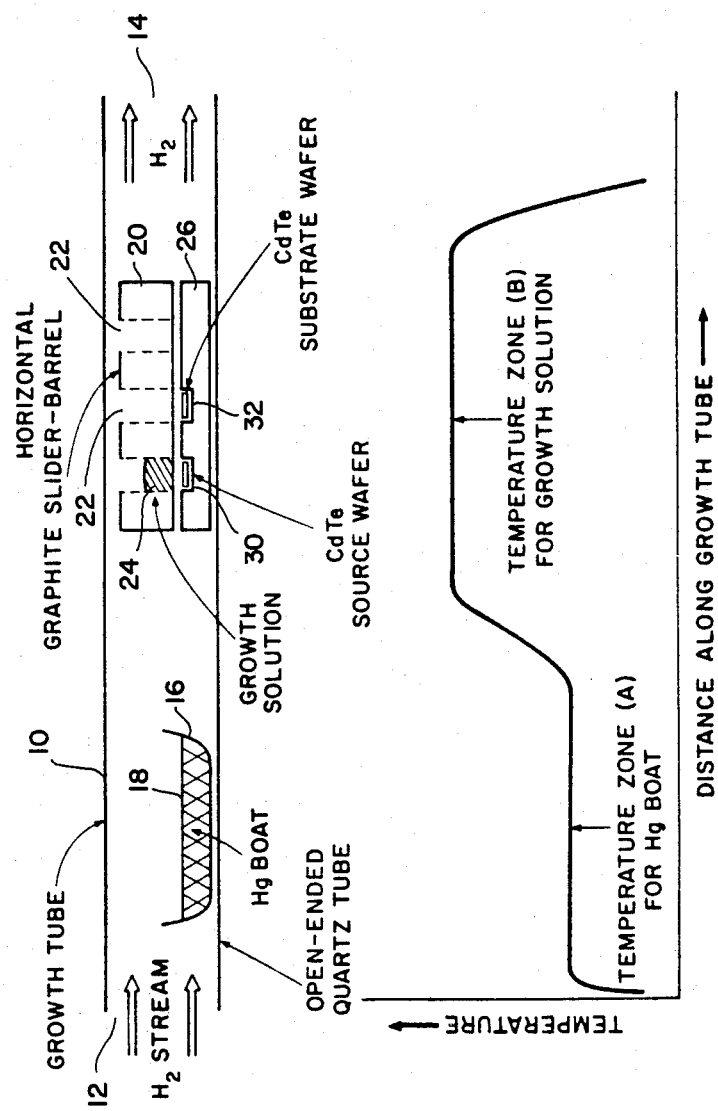
FIG. 1 is a schematic view of the apparatus utilized in this invention.

Referring to FIG. 1, the reactants are maintained within hollow growth tube 10 having an entrance 12 for a carrier gas stream such as hydrogen and an exit 14 for exit of gas and vaporous mercury. The exited gas is bubbled through a container of oil (not shown). The growth tube includes a boat 16 for mercury 18 and a conventional graphite slider 26-plate 20-barrel assembly. The plate contains hollow openings 22 for growth solution 24. A slider 26 is positioned below the plate 20 and contains hollow opening 30 for a cadmium telluride source wafer and opening 32 for a substrate wafer. The barrel, which contains the slider and plate, is not shown. In operation, carrier gas is introduced through entrance 12 of growth tube 10, passes over heated mercury 18, thereby entraining vaporous mercury which then is passed over a solution of cadmium tellurium 24, or mercury-cadmium-tellurium 24 which has been previously melted. It is necessary to maintain two distinct temperature zones, as shown by the temperature profile in FIG. 1. After a period of time of between about ½ hour and about two hours, the slider 26 is moved so that growth solution 24 is removed from contact with the source wafer and is then contacted with the substrate wafer formed of cadmium telluride, cadmium telluride selenide, zinc cadmium telluride or mercury cadmium telluride. The temperature in the growth solution zone then is reduced so that the top surface of the substrate wafer becomes coated with mercury cadmium telluride, the thickness of which is time dependent. Generally, the time of contact with the substrate wafer is between about 10 seconds and about 30 minutes, preferably between about one minute and 20 minutes in order to produce suitable material for electronic or optical components, such as detectors, solar cells, integrated electronic or optical circuits. The coated substrate then is annealed at a temperature usually between about 200° C. and about 300° C. in the presence of mercury vapor which is maintained at a partial pressure between about 0.1 Torr and 250 Torr. The particular partial pressure utilized is dependent upon the concentration and type of stoichiometric defects desired in the final mercury cadmium telluride coating on the substrate. It is to be understood that the present invention can be utilized to form multiple layers of mercury cadmium telluride on a given substrate, each layer having a different alloy composition by the process of this invention.

Specific temperature and pressure conditions utilized herein will be described with reference to FIGS. 2-15.

Figure 2:
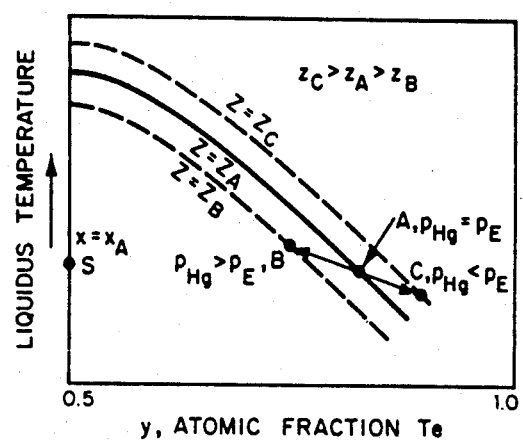
FIGS. 2 through 18 show the relationship of temperature, pressure and composition of the alloy produced by this invention.
Figure 3:
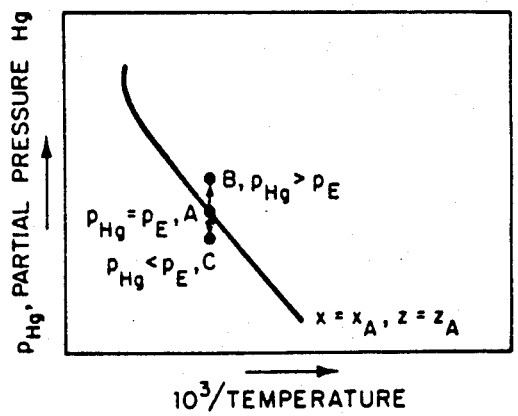

Referring to FIGS. 2 and 3 are shown the two pertinent phase diagrams, i.e., the liquidus temperature vs atomic fraction Te and the partial pressure of Hg vs reciprocal temperature. The diagram in FIG. 2 can be related to the temperature and composition of the growth solution whereas the diagram in FIG. 3 can be related to the Hg boat temperature (ordinate), and the growth solution temperature (abscissa). If a growth solution is saturated and is in equilibrium with Hg vapor, then the conditions described by point A in FIGS. 2 and 3 occur. The partial Hg vapor pressure $p_{Hg}$ is equal to the three-phase equilibrium partial pressure of Hg denoted by $p_E$. Also, the liquid would be in equilibrium with solid $Hg_{1-x}Cd_xTe$ at point S, if solid is present. If the Hg pressure is raised above $p_E$, as indicated in FIG. 3, then $p_{Hg}>p_E$ and Hg atoms are absorbed into the growth solution. As a result, the liquidus composition changes in the direction of point B as indicated in FIG. 2. As Hg is absorbed, the growth solution becomes first a supercooled liquid (if no solid is present initially), and then a two-phase mixture of liquid and solid. The melting point of the mixture becomes greater than the melting point of the original saturated solution. Also, the atomic fraction of Cd in the solution and mixture decreases, i.e., $z_B<z_A$. Similarly, if the Hg pressure is lowered below $p_E$, as indicated by the A to C arrow in FIG. 3, then Hg evaporates from the growth solution, which produces changes in the melting point and the composition of the growth solution as indicated in FIG. 2, i.e., in the direction of under-saturation or a lowered melting point and an increased atomic fraction of Cd, $z_C>z_A$.

Figure 4:
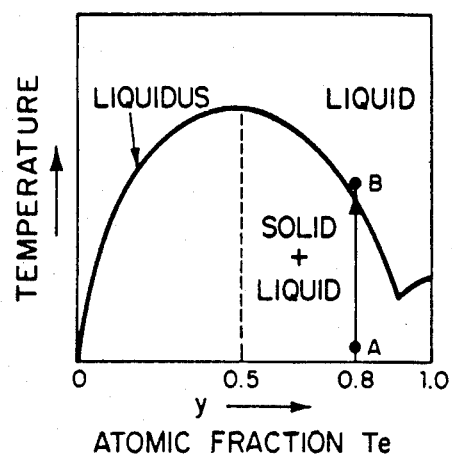
Figure 5:
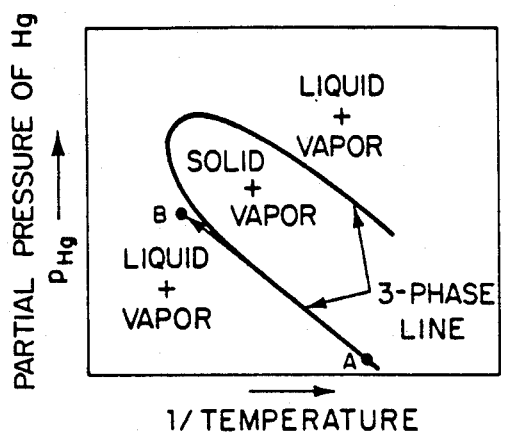
Figure 6:
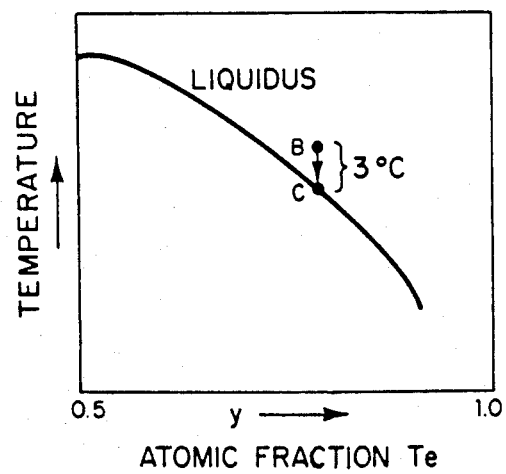
Figure 7:
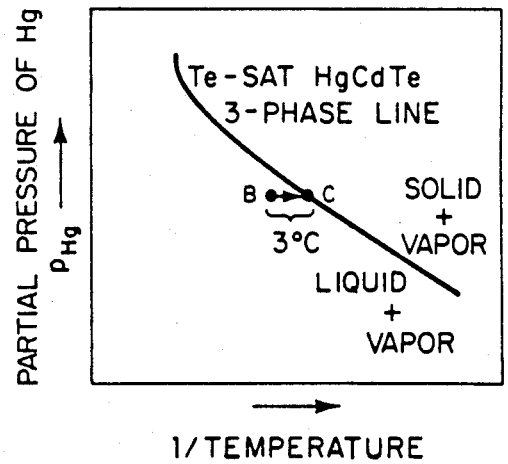
Figure 8:
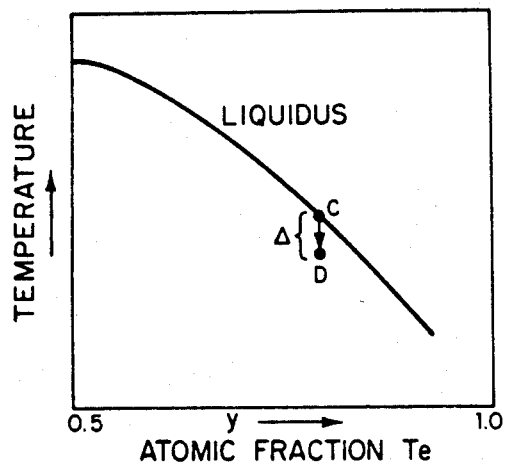
Figure 9:
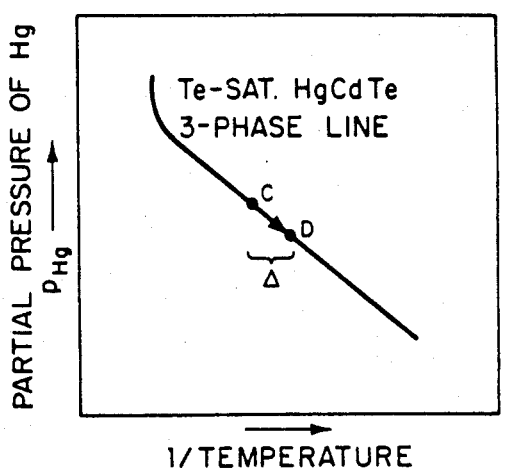
Figure 10:
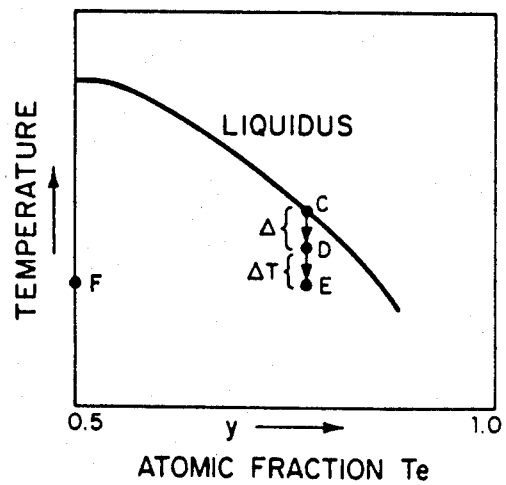
Figure 11:
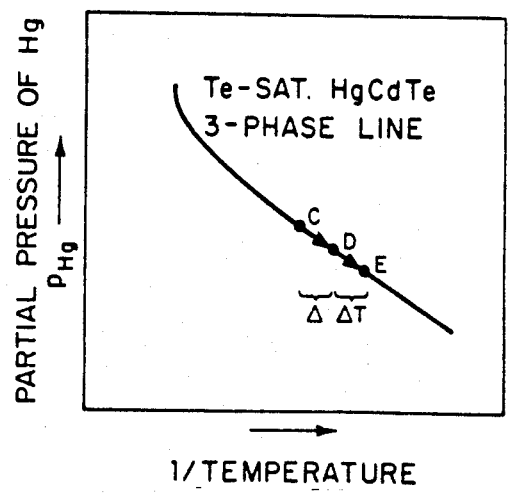
Figure 12:
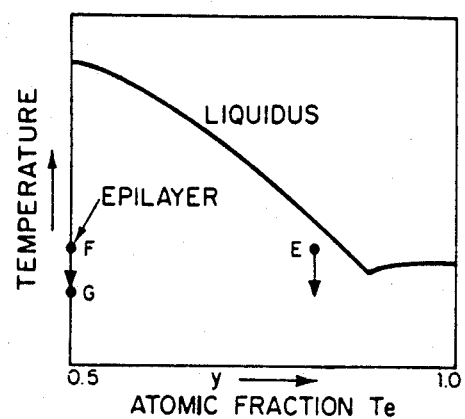
Figure 13:
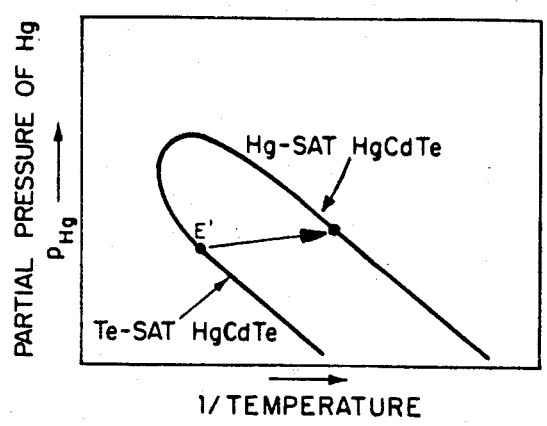
Figure 14:
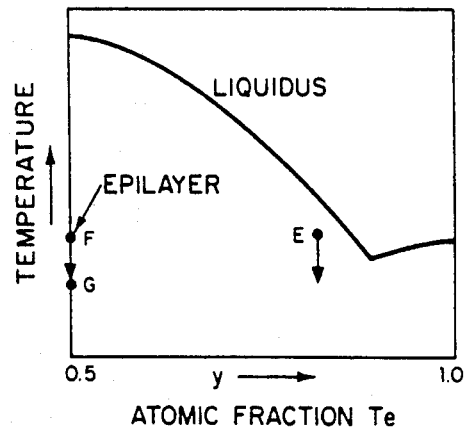
Figure 15:
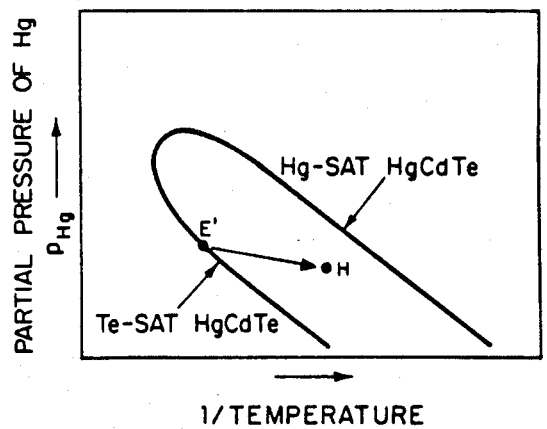

FIGS. 4 to 15 show relevant phase diagrams for HgCdTe along with operational steps for LPE growth and in situ annealing. FIGS. 4 and 5 display schematically the growth solution temperature and Hg pressure of Hg boat temperature changes superimposed on the relevant phase diagrams for the heat-up part of the growth cycle, whereas FIGS. 6 and 7 show schematically growth solution and Hg boat temperature changes prior to equilibration of the growth solution with the Hg vapor at the liquid-vapor interface and the CdTe source wafer at the solid-liquid interface. Initially, the growth solution in the graphite bin is heated from room temperature to about 3° C. above the liquidus line as indicated by the A to B arrow. Simultaneously, the Hg in the Hg boat is heated to a temperature such that the Hg partial pressure at the growth solution-Hg vapor interface falls slightly below the 3-phase line as indicated by point B. After the cadmium-tellurium mixture or the previously melted mercury-cadmium-tellurium in the solution bin is nearly saturated with mercury, the temperature of the growth solution is lowered 3° C. as indicated in FIGS. 6 and 7. At point C, the growth solution is very nearly a saturated solution. The source wafer is placed under the growth solution and the equilibration temperature is maintained for typically 60 minutes, which is long enough to insure formation of a homogeneous growth solution that is saturated by contact with the source wafer and is equilibrated with the proper Hg vapor pressure as indicated by point C in FIGS. 6 and 7. In FIGS. 8 and 9 is portrayed a schematic diagram of the growth solution and Hg boat temperature changes for the step-cooling growth mechanism. Similar changes are given for the supercooling mechanism in FIGS. 10 and 11. For growth, the source wafer is moved away from the solution bin and cooling is begun. Growth is initiated by bringing the substrate into contact with the growth solution at supercoolings of typically 2° C. to 10° C. Further cooling is discontinued for the step-cooling mechanism. For the supercooling mechanism, the cooling rate is continued so that an appreciable additional contribution to the layer thickness occurs due to continued cooling (D to E in the diagram). Note that the Hg boat temperature is changed so that the Hg vapor pressure follows the 3-phase line. Growth is terminated by moving the substrate away from the growth solution and then in situ annealing can be carried out. FIGS. 12 and 13 show a schematic diagram for post-growth in situ pseudo-isothermal annealing of HgCdTe epilayers under Hg-saturation conditions. Similarly, FIGS. 14 and 15 exhibit a schematic diagram for post-growth in situ pseudo-two-zone annealing of the HgCdTe epilayer within the solidus field. The composition of the epilayer and growth solution at the end of growth are denoted as F and E, whereas E′ denotes the Hg pressures over the epilayer. For in situ pseudo-isothermal annealing, the temperatures of the epilayer and of the Hg boat are changed to point G. The epilayer at point G is annealed typically at 250° C. for one hour and then cooled to room temperature. For the in situ two-zone annealing, the Hg pressure is changed to point H, which is within the solidus field. Thus, various epilayer compositions can be achieved with extremely small and controllable deviations from stoichiometry.

In one aspect of the invention, chemical impurities such as phosphorous, arsenic, indium, or silicon are added to effect a change in electrical properties to render the coating electron conductive or hole conductive. The chemical impurities are added to the initial growth solution or with the mercury vapor.

The following example illustrates the present invention and is not intended to limit the same.

EXAMPLE I

In Table I, some typical LPE growth parameters and characterization data are given. The typical growth temperature range is 496° C. to 488° C. Although the data of the right-hand column of Table I suggests only a trend, more extensive measurements over a wider range of Hg boat temperatures indicated the sensitivity of the run-to-run dependence of alloy composition on the Hg boat temperature. (for constant growth solution temperature) during the 1 hour equilibration phase of the growth cycle, i.e., higher Hg boat temperature correlates with a lower CdTe content of the alloy and vice versa in agreement with theory. The transmission cutoff wavelength $\lambda_c$ (for 1% transmission), correlates satisfactorily with the mole fraction of CdTe in the layers.

TABLE Ia

Some LPE Growth Parameters

| Run No. | Cooling Rate $R_G$. °C./min | Growth Time t, min | Degrees of Super- cooling Δ, °C. | Growth Temp. Range °C. | Equilibra- tion Temp. of Hg Boat °C. |
|---|---|---|---|---|---|
| 151 | 2.7 | 1.0 | 10 | 450–447.3 | — |
| 893 | 0.28 | 30 | 2 | 496–488 | 276.2* |
| 894 | 0.28 | 30 | 2 | 496–488 | 276.4 |
| 895 | 0.28 | 30 | 2 | 496–488 | 276.2 |
| 896 | 0.28 | 30 | 2 | 496–488 | 276.0 |

*For static conditions, Hg boat temperature would be approximately 260°.

TABLE Ib

Some Characterization Data

| Run No. | Substrate Area, mm² | Layer Thickness d, (μm) | Transmission Cutoff $\lambda_c$, (μm) | Mole Fraction CdTe, x |
|---|---|---|---|---|
| 151 | 4 × 10 | 7 | — | 0.205 ± .003** |
| 893 | 8 × 8 | 30 | 6.8 | 0.187 ± .024 |
| 894 | 8 × 8 | 33 | 7.6 | 0.165 ± .028 |
| 895 | 8 × 8 | 32 | 7.2 | 0.168 ± .007 |

TABLE Ib-continued

Some Characterization Data

| Run No. | Substrate Area, mm² | Layer Thickness d, (μm) | Transmission Cutoff $\lambda_c$, (μm) | Mole Fraction CdTe, x |
|---|---|---|---|---|
| 896 | 8 × 8 | 30 | 5.9 | 0.219 ± .035 |

**No inhomogeneity detected, since estimated error limit of electron microprobe is ± .003.

Table II exhibits additional characterization data. Layer thicknesses are in the 5 to 40 μm range. After in situ annealing, the carrier concentrations of the layers are typically in the low $10^{16}/cm^3$ range.

TABLE II

Additional Characterization Data

| Run No. | Growth Time, min | Thickness (μm) | LPE Layer Anneal* Temp. °C. | Hg Boat Anneal* Temp. °C. | Mole Fraction CdTe, x | Carrier Concentration cm⁻³, 77K | Carrier Mobility cm²/V-sec |
|---|---|---|---|---|---|---|---|
| 845 | 10 | 5 | — | — | 0.168 ± .029 | 8.6 × 10¹⁵ | 9.7 × 10⁴ |
| 883 | 10 | 10 | 250 | 250 | 0.147 ± 0.19 | 1.3 × 10¹⁷ | 7 × 10⁴ |
| 884 | 10 | 7 | 350 | 250 | 0.140 ± .018 | 4.1 × 10¹⁶ | 4.3 × 10⁴ |
| 896 | 30 | 30 | 250 | 250 | 0.219 ± .035 | 1.0 × 10¹⁶ | 6.1 × 10⁴ |
| 904 | 30 | 18 | 250 | 275 | 0.125 ± .026 | 2.1 × 10¹⁶ | 1.4 × 10⁵ |
| 906 | 30 | 20 | 275 | 275 | 0.196 ± .006 | 1.0 × 10¹⁶ | 1.0 × 10⁵ |
| 908 | 30 | 40 | 250 | 250 | 0.121 ± .015 | 3.0 × 10¹⁶ | 2.8 × 10⁵ |

*Anneal time 1 hour.

Figure 16:
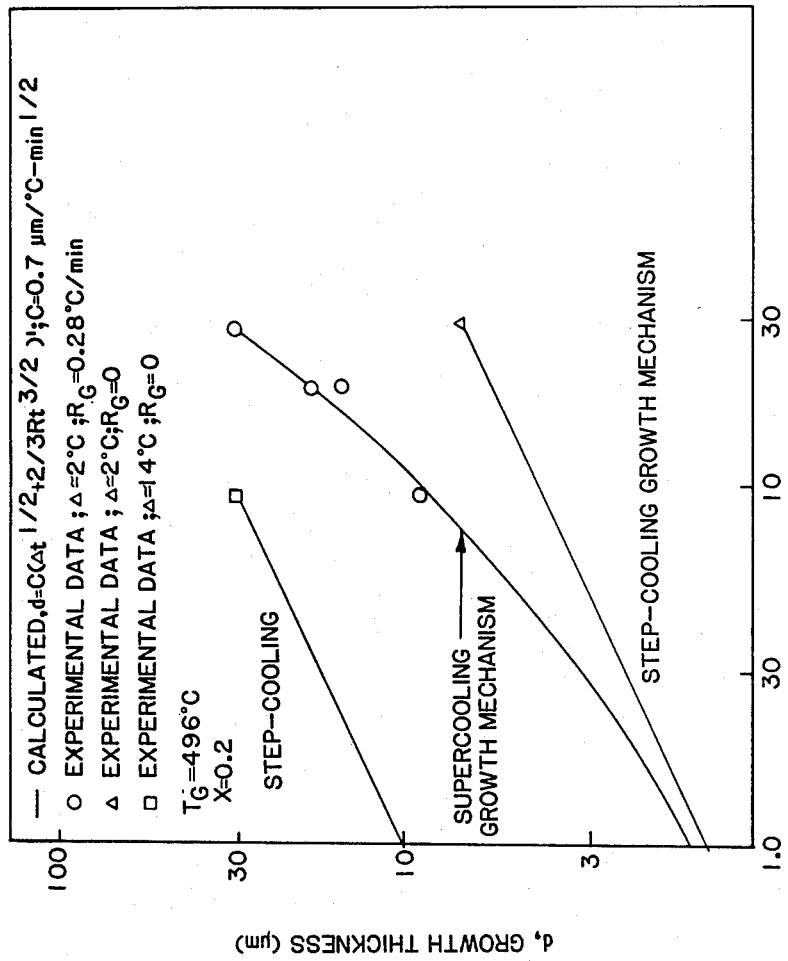
Figure 17:
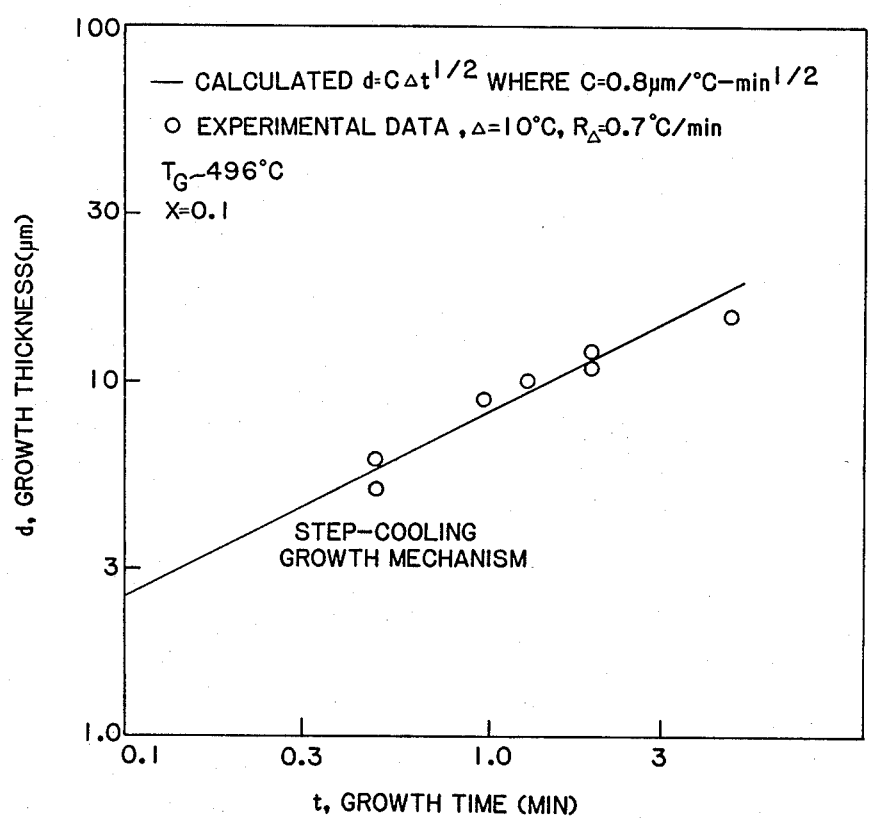

In FIG. 16, the layer thickness, d, is plotted for various growth times, t. Data are presented for HgCdTe layers grown by both the step-cooling and the supercooling techniques for x=0.2. For a supercooled solution being further cooled by ramping, the layer thickness d relationship[6, 7] is given as:

$$d = C(\Delta t^{\frac{1}{2}} + \tfrac{2}{3} R_G t^{3/2}) \quad (1)$$

where C is the material constant, Δ is the degrees supercooling, $R_G$ is the cooling rate during growth and t is the growth time. By fitting the experimental data to the d vs t equation, the material constant C is found to be 0.7 μm/°C.-min^½. The growth of the epilayers is initiated at a growth temperature $T_G$ of about 496° C. with cooling rates $R_G$ of 0 and 0.28° C./min for the step-cooling and supercooling techniques, respectively. In the step-cooling experiments, 2° and 14° C. of supercooling were used. The cooling rates for supercooling $R_\Delta$ were 0.67° C./min and 0.28° C./min for the step-cooling and supercooling techniques, respectively. In FIG. 17, d vs t data are shown for x=0.1, $T_G$=496° C., $R_\Delta$=0.67° C./min, $R_G$=0 and Δ=10° C. It is seen that the experimental data are in satisfactory agreement with Eq. (1) for C=0.8 μm/°C.-min^½.

Figure 18:
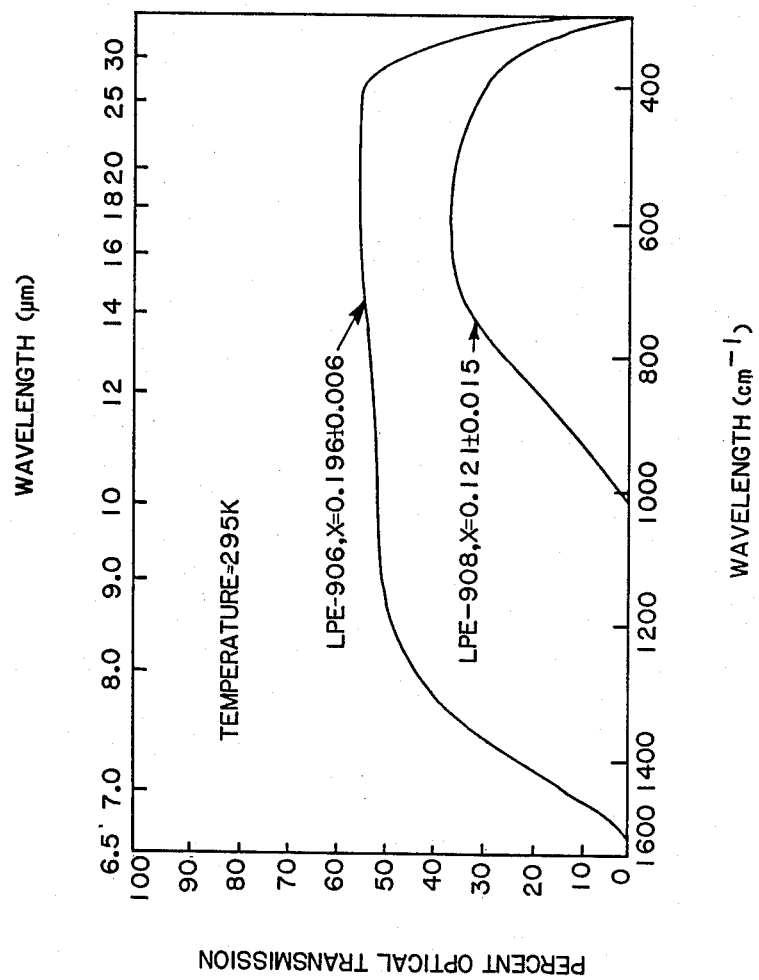

For each epitaxial layer, optical transmission measurements are made on the layer-substrate composite with a double-beam spectrophotometer having a light-spot area of 25 mm². In FIG. 18, the percent transmission is plotted against wave number and wavelength for two representative layers with CdTe mole fractions of 0.121 and 0.196, as determined by electron microprobe analysis. The photon cutoff wavelength for run #906 is in good agreement with the literature value for this composition. The sharpness of the absorption edge is consistent with good depth and lateral homogeneity.

Bridgman Growth of CdTe

An important factor in the growth of high quality LPE-grown layers of HgCdTe is the use of high quality substrates. For the preparation and Bridgman growth of CdTe boules for substrates, stoichiometric quantities of high purity elements are sealed in evacuated and then backfilled (argon), carbon-coated quartz tubes. The capsule is placed in a single furnace which is initially in a nearly horizontal position. A slight tilt in the furnace keeps the liquid and solid materials at the small diameter end of the tube. The temperature of the furnace is raised to its final temperature of about 1110° C. at the conical tip end of the growth tube and approximately 100° C. lower at the other end, held at temperature for 16 to 20 hrs., then the furnace is rotated about 90° to a vertical position. After the temperature is stabilized, the tube is lowered at a rate of about 1.2 mm/hr until the solution has completely solidified. With this procedure, ingots of CdTe containing large monocrystalline regions were reproducibly grown. Entirely single crystal boules are grown occasionally. Twin-free (111) oriented wafers with typically $10^5$ dislocations/cm$^2$ are cut from the boules. There is no evidence of physical holes or inclusions in the boules. The CdTe wafers so prepared have been used as substrates for the growth of the high quality LPE layers of HgCdTe described above.

I claim:

1. The process for forming mercury cadmium telluride which comprises forming an atmosphere of mercury vapor from liquid mercury having a desired temperature between about 25° C. and 350° C. while maintaining the liquid mercury temperature within about 1° C. of the desired temperature and contacting the mercury vapor with a growth solution consisting of mercury, cadmium, and tellurium having a desired temperature between about 425° C. and 550° C. and maintaining the growth solution temperature within about 1° C. of the desired temperature.

2. The process for forming a substrate-epilayer composite having an epitaxial layer of mercury cadmium telluride which comprises forming an atmosphere of vaporous mercury from liquid mercury, having a desired temperature between about 25° C. and 350° C. while maintaining the liquid mercury within about 1° C. of the desired temperature and contacting said mercury vapor with a growth solution consisting of mercury, cadmium and tellurium having a desired temperature between about 425° C. and 550° C. and maintaining the growth solution temperature within about 1° C. of the desired temperature to form a compositionally controlled solution of mercury-cadmium-tellurium and contacting the solution of mercury-cadmium-tellurium with a substrate to form an epitaxial layer of mercury cadmium telluride on said substrate.

3. The process of claim 1 wherein the liquid mercury is maintained within about 0.2° C. of the desired liquid mercury temperature.

4. The process of claim 2 wherein the liquid mercury is maintained within about 0.2° C. of the desired liquid mercury temperature.

5. The process of any one of claims 1, 2, 3 or 4 wherein the growth solution is maintained within 0.2° C. of the desired temperature.

6. A process for preparing epitaxial layers of $Hg_{1-x}Cd_xTe$ on suitable substrates comprising the steps of:

(a) placing an initial source material selected from the group consisting of tellurium, a mixture of mercury and tellurium or a mixture of mercury, tellurium and cadmium in a growth bin and a CdTe source wafer and substrate wafer in a slider insert;

(b) heating the initial source material, source wafer and substrate wafer to a temperature at which simultaneously heated Hg in a boat produces a mercury vapor pressure over the source material and within time converts the initial source material to a solution material of mercury-tellurium or mercury-cadmium-tellurium;

(c) sliding the CdTe source wafer so that contact is made with the solution for a period of time;

(d) further sliding the CdTe source wafer so that contact is no longer made with the solution;

(e) sliding the CdTe substrate wafer so that contact is made with the solution for a period of time sufficient to produce a desired thickness of epitaxial layer of HgCdTe on the CdTe substrate;

(f) further sliding of the CdTe substrate wafer so that contact is no longer made with the solution; and (g) maintaining the temperature of said heated mercury between about 1° C. of a desired temperature and maintaining the temperature of the solution within about 1° C. of a desired temperature and wherein the heated mercury temperature is less than the temperature of the solution.

7. A process according to claim 6 wherein a plurality of layers of mercury cadmium telluride are grown onto the substrate thereby producing multi-layer structures.

8. A process according to claims 6 or 7 wherein the epitaxial layer is subsequently subjected to a heat treatment to adjust its native defect density, which in turn adjusts the free carrier concentration.

9. A process according to claims 6 or 7 wherein chemical impurities are added to the growth solution material or mercury vapor to effect doping the epitaxial layer to form an n-type or p-type layer.

* * * * *